(12) United States Patent
Cane et al.

(10) Patent No.: US 8,342,089 B2
(45) Date of Patent: Jan. 1, 2013

(54) PRINTING SCREENS, FRAMES THEREFOR AND PRINTING SCREEN UNITS

(75) Inventors: Paul Lionel Cane, Weymouth (GB); Peter John Jefferies, Dorchester (GB); Terry Andrew Smith, Weymouth (GB); Anthony Michael Weldon, Portland (GB)

(73) Assignee: DEK International GmbH, Zurich (CH)

( * ) Notice: Subject to any disclaimer, the term of this patent is extended or adjusted under 35 U.S.C. 154(b) by 960 days.

(21) Appl. No.: 12/278,821

(22) PCT Filed: Feb. 6, 2007

(86) PCT No.: PCT/GB2007/000392
§ 371 (c)(1),
(2), (4) Date: Dec. 16, 2008

(87) PCT Pub. No.: WO2007/091035
PCT Pub. Date: Aug. 16, 2007

(65) Prior Publication Data
US 2009/0217831 A1    Sep. 3, 2009

(30) Foreign Application Priority Data

Feb. 8, 2006 (GB) .................................. 0602482.2

(51) Int. Cl.
*B41F 15/36* (2006.01)
*B41N 1/24* (2006.01)
(52) U.S. Cl. .................... 101/127.1; 101/127; 101/128.1
(58) Field of Classification Search .................. 101/114, 101/127, 127.1, 128, 128.1; B41F 15/36
See application file for complete search history.

(56) References Cited

U.S. PATENT DOCUMENTS

| 4,442,772 | A |   | 4/1984 | Bubley |
| 5,979,312 | A | * | 11/1999 | Williams ........................ 101/127 |
| 6,038,969 | A |   | 3/2000 | Podlipec et al. |
| 6,289,804 | B1 |  | 9/2001 | Williams |
| 6,561,089 | B1 |  | 5/2003 | Newman, Jr. |
| 2003/0230204 | A1 | | 12/2003 | Komata |

FOREIGN PATENT DOCUMENTS

| DE | 196 15 058 | 10/1997 |
| DE | 202 09 385 | 8/2002 |
| EP | 0 643 902 | 3/1998 |
| EP | 1 308 275 | 5/2003 |
| EP | 1 308 275 | 8/2004 |
| GB | 2 294 905 | 5/1996 |

(Continued)

*Primary Examiner* — Leslie J Evanisko
(74) *Attorney, Agent, or Firm* — Renner, Otto, Boisselle & Sklar, LLP

(57) ABSTRACT

A printing screen unit (110), comprising: a printing screen (112), comprising a sheet, at least sections of at least one pair of opposite edges of which include one of engagement apertures (124) or engagement projections; and a supporting frame (114) including at least one pair of interface units (116, 117) which are attached to the at least one pair of opposite edges of the printing screen (112), wherein the interface units (116, 117) each comprise at least one coupling element (130) which includes the other of engagement apertures or engagement projections (158) for inter-engaging with the one of engagement apertures (124) or engagement projections at a respective one of the opposite edges of the printing screen (112), and an interface member (126) which includes a coupling slot (142) for captively receiving the at least one coupling element (130) therein.

44 Claims, 6 Drawing Sheets

FOREIGN PATENT DOCUMENTS

| | | |
|---|---|---|
| GB | 2 407 799 | 11/2003 |
| JP | 09 187914 | 7/1997 |
| WO | 93/25061 | 12/1993 |
| WO | 97/03833 | 2/1997 |
| WO | 02/058930 | 8/2002 |
| WO | 03/015486 | 2/2003 |
| WO | 03/093012 | 11/2003 |
| WO | 03/106175 | 12/2003 |
| WO | 03/107727 | 12/2003 |

\* cited by examiner

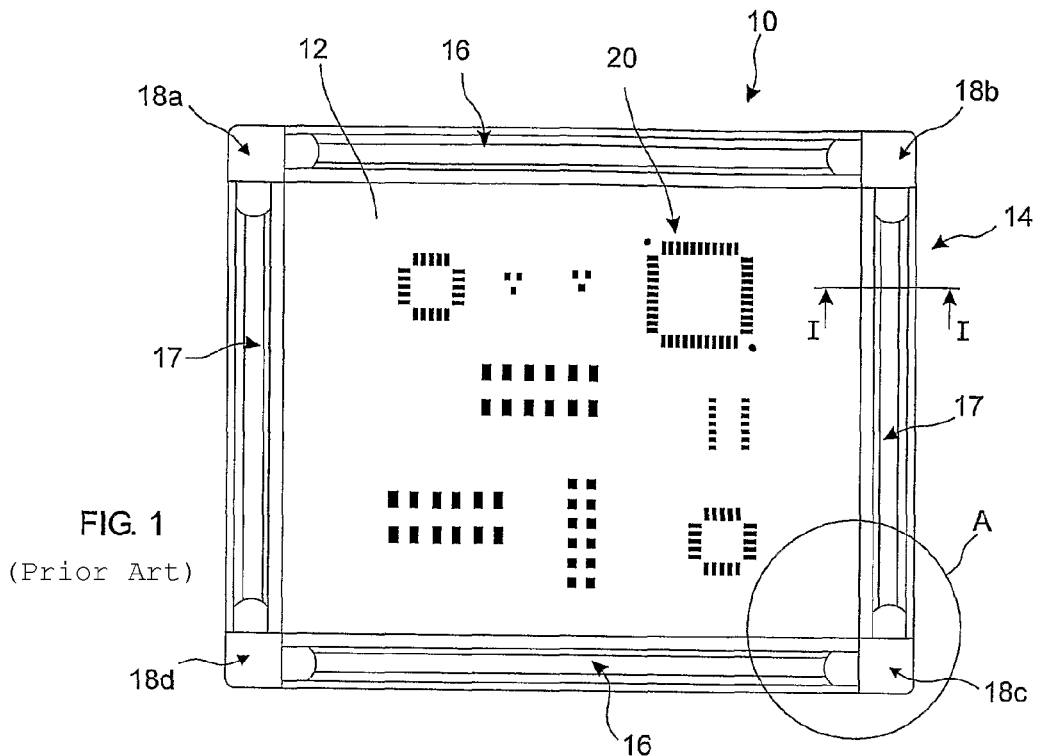
FIG. 1 (Prior Art)
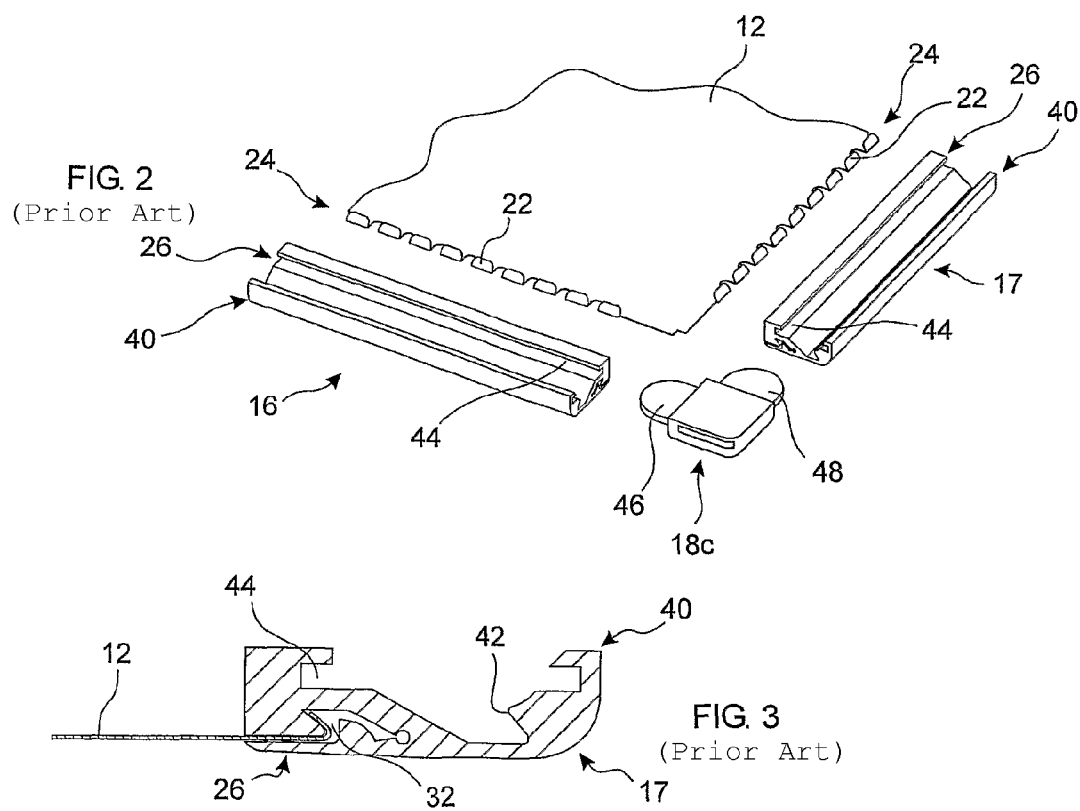
FIG. 2 (Prior Art)
FIG. 3 (Prior Art)

PRINTING SCREENS, FRAMES THEREFOR AND PRINTING SCREEN UNITS

This application is a national phase of International Application No. PCT/GB2007/000392 filed Feb. 6, 2007 and published in the English language.

The present invention relates to printing screens, often alternatively referred to as stencils or masks, for use in the screen printing of workpieces, typically electronic substrates, such as circuit boards and components, frames therefor, and printing screen units.

BACKGROUND

Traditionally, printing screens have been mounted in large rectangular frames by a flexible, perforate sheet, typically a woven mesh of polypropylene or stainless steel strands, which acts to tension the printing screen.

Whilst the above-described mounting system has been well used, the mounting system does exhibit a number of drawbacks, notably in not allowing the printing screen to be detached from the frame without permanently damaging the perforate sheet, which requires the printing screens to be maintained in the mounted state, and thus requires a large storage facility for storing a large number of mounted printing screens.

More recently, as disclosed in WO-A-1997/003833, a mounting system has been developed which enables the printing screen to be demounted after use, and thus enables the use of a single frame with a large number of printing screens, thereby obviating the problem of the earlier mounting system regarding storage. In this mounting system, the printing screen, which comprises a thin, stiff metal sheet, typically of stainless steel, includes a plurality of fixing apertures at the opposite edges thereof by which the printing screen is mounted to a frame by mechanical tensioning mechanisms which engage the fixing apertures in the printing screen and act to tension the printing screen, with the tensioning force typically being provided by hydraulic, pneumatic or spring means.

Whilst the above-described mounting system has also been well used, this mounting system does suffer from a number of drawbacks. In particular, as the printing screens are very thin, typically having a thickness of from 0.1 to 0.25 mm, the edges thereof are razor sharp, which can lead to personal injury to a user if not handled with the utmost care.

Still more recently, as disclosed in WO-A-2003/093012 and illustrated in FIGS. 1 to 3, a mounting system has been developed which enables a printing screen to be demounted after use, and also, in utilizing an attachment frame, typically in the form of extrusions, shields the edges of the printing screen and thus prevents the possibility of personal injury to a user as could be caused by the sharp edges of a printing screen.

The above-described mounting system has been widely accepted. However, this mounting system does suffer from the drawback of requiring the edges of the printing screen to be cut and formed, typically by bending, to allow for the fitting of the attachment frame. Such cutting and forming adds both to the time and the cost in fabricating the resulting printing screen units.

SUMMARY OF THE INVENTION

The present invention provides a printing screen unit which at least partially overcomes the above-mentioned problems associated with existing printing screen units, and printing screens and frames for such printing screen units.

In one aspect the present invention provides a printing screen unit, comprising: a printing screen, comprising a sheet, at least sections of at least one pair of opposite edges of which include one of engagement apertures or engagement projections; and a supporting frame including at least one pair of interface units which are attached to the at least one pair of opposite edges of the printing screen, wherein the interface units each comprise at least one coupling element which includes the other of engagement apertures or engagement projections for inter-engaging with the one of engagement apertures or engagement projections at a respective one of the opposite edges of the printing screen, and an interface member which includes a coupling slot for captively receiving the at least one coupling element therein.

In one embodiment at least ones of the engagement apertures and engagement projections are circular in shape.

In one embodiment the at least one pair of opposite edges of the printing screen include engagement apertures and the at least one coupling element of each interface unit includes engagement projections for engagement with the engagement apertures in the respective edges of the printing screen.

In one embodiment at least sections of the at least one pair of opposite edges of the printing screen include a plurality of rows of one of engagement apertures or engagement projections which are disposed one inwardly of the other relative to the respective edge of the printing screen and the coupling elements of the interface units include a plurality of rows of the other of engagement apertures or engagement projections which correspond to the rows of the one of engagement apertures or engagement projections in the respective edges of the printing screen.

In one embodiment the rows of the one of engagement apertures or engagement projections in each edge of the printing screen are located in offset relation along a length of the respective edge of the printing screen and the rows of the other of engagement apertures or engagement projections on each coupling element are located in a counterpart offset relation.

In one embodiment the interface member includes a coupling section which comprises first and second body parts which together define the coupling slot.

In one embodiment the coupling slot comprises a support slot part which supports the at least one coupling element and includes an engagement surface at an inner edge thereof, against which the at least one coupling element is engaged when a tensioning force is applied to the interface member.

In one embodiment the coupling slot comprises a recessed slot part which includes at least one recess into which extend the distal ends of the engagement projections, such as to retain the printing screen captively thereon.

In one embodiment the supporting slot part and the recessed slot part are disposed in opposed relation.

In one embodiment the interface member includes an engagement section which, relative to the printing screen, is disposed outwardly of the coupling slot and provides for engagement to a tensioning mechanism.

In one embodiment the supporting frame includes one pair of interface units which are attached to one pair of opposite edges of the printing screen.

In another embodiment the printing screen has two pairs of opposite edges, at least sections of which include the one of engagement apertures or engagement projections, and the supporting frame comprises first and second pairs of interface units which are attached to the respective pairs of opposite edges of the printing screen.

In one embodiment the supporting frame further comprises corner pieces which are disposed adjacent ends of the interface units.

In one embodiment the corner pieces couple adjacent ends of the interface units.

In one embodiment the corner pieces are parts separate to the interface units.

In another embodiment the corner pieces are integral parts of at least ones of the interface units.

In one embodiment the interface members of one of the pairs of interface units are longer than the interface members of the other of the pairs of interface units, such that the ends of the interface members of the one of the pairs of interface units overlap the adjacent ends of the interface members of the other of the pairs of interface units.

In one embodiment the corner pieces are parts separate to the interface units and are attached to the ends of the interface members of the one of the pairs of interface units.

In another embodiment the corner pieces are defined by the ends of the interface members of the one of the pairs of interface units.

In one embodiment each coupling element comprises an elongate strip which includes the other of engagement apertures or engagement projections thereon.

In one embodiment at least ones of the interface units comprise a plurality of coupling elements.

In one embodiment the coupling elements are disposed in end-to-end relation along a length of the interface member.

In another embodiment the coupling elements are disposed in spaced relation along a length of the interface member.

In one embodiment the supporting frame provides for relative movement of the interface members on being tensioned by a tensioning mechanism.

In one embodiment the printing screen includes a pattern of printing apertures which define a pattern of deposits to be printed thereby.

In another embodiment the printing screen is a blank and includes no printing apertures therein.

In one embodiment the printing screen comprises a metal sheet.

In another embodiment the printing screen comprises a plastics sheet.

In another aspect the present invention provides a supporting frame for supporting a printing screen, comprising a sheet, at least sections of at least one pair of opposite edges of which include one of engagement apertures or engagement projections, the supporting frame comprising: at least one pair of interface units which are attachable to the at least one pair of opposite edges of the printing screen, wherein the interface units each comprise at least one coupling element which includes the other of engagement apertures or engagement projections for inter-engaging with the one of engagement apertures or engagement projections at a respective one of the opposite edges of the printing screen, and an interface member which includes a coupling slot for captively receiving the at least one coupling element therein.

In one embodiment at least ones of the engagement apertures and engagement projections are circular in shape.

In one embodiment the at least one pair of opposite edges of the printing screen include engagement apertures and the at least one coupling element of each interface unit includes engagement projections for engaging the engagement apertures in the edges of the printing screen.

In one embodiment at least sections of the at least one pair of opposite edges of the printing screen include a plurality of rows of one of engagement apertures or engagement projections which are disposed one inwardly of the other relative to the respective edge of the printing screen and the coupling elements of the interface units include a plurality of rows of the other of engagement apertures or engagement projections which correspond to the rows of the one of engagement apertures or engagement projections in the respective edges of the printing screen.

In one embodiment the rows of the one of engagement apertures or engagement projections in each edge of the printing screen are located in offset relation along a length of the respective edge of the printing screen and the rows of the other of engagement apertures or engagement projections on each coupling element are located in a counterpart offset relation.

In one embodiment the interface member includes a coupling section which comprises first and second body parts which together define the coupling slot.

In one embodiment the coupling slot comprises a support slot part which supports the at least one coupling element and includes an engagement surface at an inner edge thereof, against which the at least one coupling element is engaged when a tensioning force is applied to the interface member.

In one embodiment the coupling slot comprises a recessed slot part which includes at least one recess into which extend the distal ends of the engagement projections, such as to retain the printing screen captively thereon.

In one embodiment the supporting slot part and the recessed slot part are disposed in opposed relation.

In one embodiment the interface member includes an engagement section which is disposed outwardly of the coupling slot and provides for engagement to a tensioning mechanism.

In one embodiment the supporting frame includes: one pair of interface units which are in use attached to one pair of opposite edges of the printing screen.

In one embodiment the printing screen has two pairs of opposite edges, at least sections of which include the one of engagement apertures or engagement projections, and comprises: first and second pairs of interface units which are in use attached to the respective pairs of opposite edges of the printing screen.

In one embodiment the supporting frame further comprises: corner pieces which are disposed adjacent ends of the interface units.

In one embodiment the corner pieces couple adjacent ends of the interface units.

In one embodiment the corner pieces are parts separate to the interface units.

In another embodiment the corner pieces are integral parts of at least ones of the interface units.

In one embodiment the interface members of one of the pairs of interface units are longer than the interface members of the other of the pairs of interface units, such that the ends of the interface members of the one of the pairs of interface units overlap the adjacent ends of the interface members of the other of the pairs of interface units.

In one embodiment the corner pieces are parts separate to the interface units and are attached to the ends of the interface members of the one of the pairs of interface units.

In another embodiment the corner pieces are defined by the ends of the interface members of the one of the pairs of interface units.

In one embodiment each coupling element comprises an elongate strip which includes the other of the engagement apertures or engagement projections thereon.

In one embodiment at least ones of the interface units comprise a plurality of coupling elements.

In one embodiment the coupling elements are disposed in end-to-end relation along a length of the interface member.

In another embodiment the coupling elements are disposed in spaced relation along a length of the interface member.

In one embodiment the supporting frame is configured to provide for relative movement of the interface members on being tensioned by a tensioning mechanism.

In a further aspect the present invention provides a printing screen, comprising a sheet, at least sections of at least one pair of opposite edges of which include one of engagement apertures or engagement projections.

In one embodiment at least ones of the engagement apertures or engagement projections are circular in shape.

In one embodiment the at least one pair of opposite edges of the printing screen include engagement apertures.

In one embodiment at least sections of the at least one pair of opposite edges of the printing screen include a plurality of rows of one of engagement apertures or engagement projections which are disposed one inwardly of the other relative to the respective edge of the printing screen.

In one embodiment the rows of the one of engagement apertures or engagement projections in each edge of the printing screen are located in offset relation along a length of the respective edge of the printing screen.

In one embodiment the printing screen has two pairs of opposite edges, at least sections of which include the one of engagement apertures or engagement projections.

In one embodiment the printing screen includes a pattern of printing apertures which define a pattern of deposits to be printed thereby.

In another embodiment the printing screen is a blank and includes no printing apertures therein.

In one embodiment the printing screen comprises a metal sheet.

In another embodiment the printing screen comprises a plastics sheet.

The present invention provides an improved printing screen unit which is compatible with existing support frame systems, with the interface members protecting edges of the printing screen from damage during handling and mounting, thereby increasing the life of the printing screen, and the sharp edges of the printing screen being enclosed, making the printing screen safer to handle.

Furthermore, the attachment of a printing screen to interface members further simplifies the manufacture of the printing screen unit as a whole, in obviating the need for an adhesive bond.

BRIEF DESCRIPTION OF THE DRAWINGS

Preferred embodiments of the present invention will now be described hereinbelow by way of example only with reference to the accompanying drawings, in which:

FIG. 1 illustrates a plan view of a prior art printing screen unit;

FIG. 2 illustrates an exploded perspective view from above of one corner region (region A in FIG. 1) of the printing screen unit of FIG. 1;

FIG. 3 illustrates a vertical sectional view (along section I-I in FIG. 1) through an edge region of the printing screen unit of FIG. 1;

DETAILED DESCRIPTION

Figure 4:
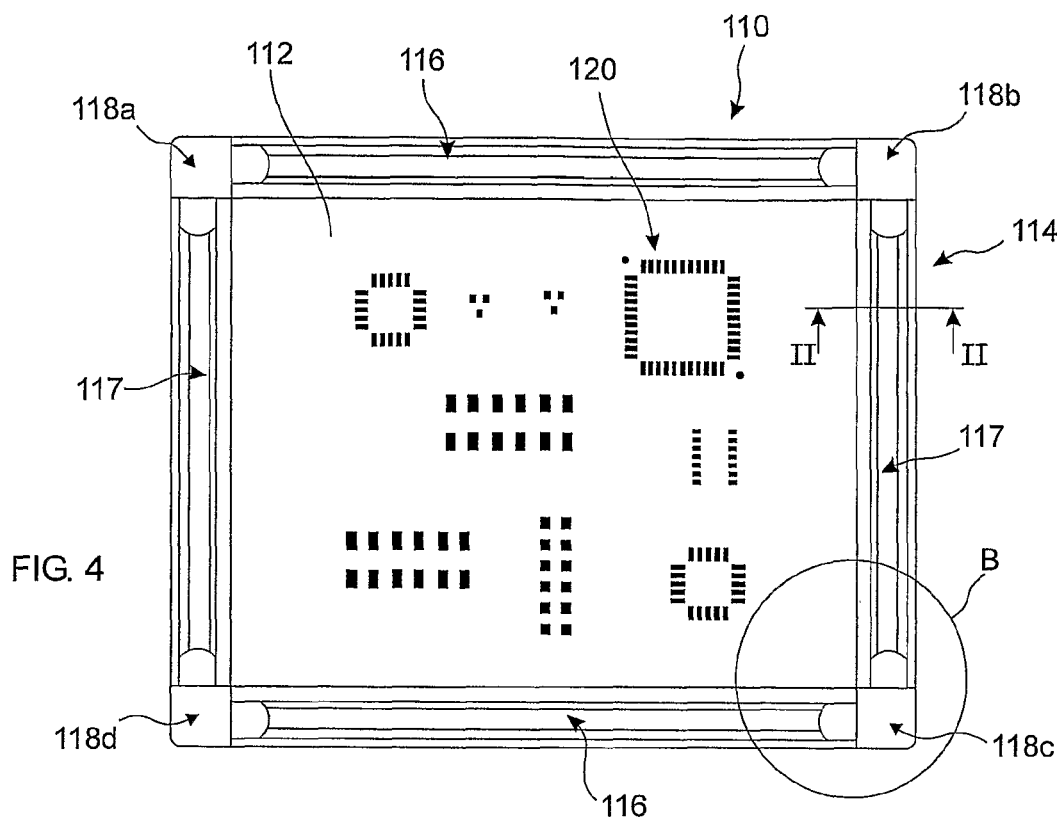
FIG. 4 illustrates a plan view of a printing screen unit in accordance with a first embodiment of the present invention.

FIGS. 1 to 3 illustrate a prior art printing screen unit 10, as disclosed in WO-A-2003/093012.

The printing screen unit 10 comprises a printing screen 12, in this embodiment of rectangular shape, and a supporting frame 14 for supporting the printing screen 12, which comprises first and second pairs of interface members 16, 16, 17, 17 which are attached to the respective pairs of opposite edges of the printing screen 12 and first to fourth corner pieces 18a-d which couple the respective ones of the interface members 16, 16, 17, 17.

The printing screen 12 includes a pattern of printing apertures 20 which define the pattern of deposits to be printed. The pattern of printing apertures 20 are typically formed by laser cutting or etching. The printing screen 12 typically comprises a sheet of a metal, such as stainless steel, or a plastic.

The edges of the printing screen 12 to which tensioning mechanisms are attached each comprise a plurality of spaced projections 22 along the length thereof which define a castellated structure, and are folded to define attachment elements 24. The edges of the printing screen 12 are each folded along a line intersecting the projections 22, such that the projections 22 define a hook element and the attachment elements 24, as defined thereby, enclose an acute angle with the main body of the printing screen 12.

The interface members 16, 16, 17, 17 each include an attachment section 26 which defines an attachment slot 32 which extends along the length thereof and in which a respective one of the attachment elements 24 of the printing screen 12 is located.

The interface members 16, 16, 17, 17 each further include an engagement section 40 which, relative to the printing screen 12, is disposed outwardly of the attachment section 26 and provides for engagement to a tensioning mechanism.

The engagement section 40 includes an inwardly-facing engagement surface 42 which extends along the length of the respective interface member 16, 16, 17, 17 and defines a hook arrangement which provides for captive engagement with a tensioning mechanism.

The interface members 16, 16, 17, 17 each further include a recess 44, in this embodiment of substantially rectangular section, which extends to the distal ends thereof for receiving the tongue elements 46, 48 of respective corner pieces 18a-d, as will be described in more detail hereinbelow.

The corner members 18a-d each include first and second tongue elements 46, 48, which extend in orthogonal directions, for fitting in respective ones of the recesses 44 in the distal ends of the adjacent interface members 16, 16, 17, 17.

In this embodiment the tongue elements 46, 48 of the corner members 18a-d are configured such as to be a tight fit in the recesses 44 in the distal ends of interface members 16, 16, 17, 17, but such as to allow for movement of the tongue elements 46, 48 in the respective recesses 44 in the direction of a tension as applied to the printing screen 12. With this configuration, the interface members 16, 16, 17, 17 present a substantially rigid frame when handled, but allow for relative movement of respective opposite pairs of the interface members 16, 16, 17, 17 on being tensioned by tensioning mechanisms. Also, in allowing for relative movement of the interface members 16, 16, 17, 17, design tolerances can be accommodated in order to provide for uniform tensioning of the printing screen 12.

Figure 5:
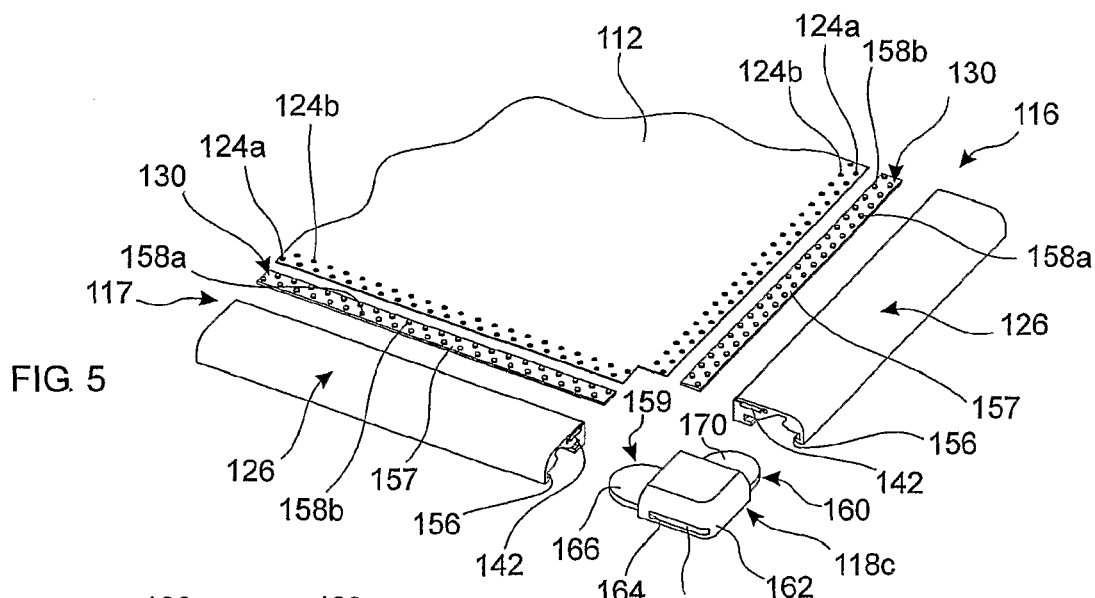
FIG. 5 illustrates an exploded perspective view from below of one corner region (region B in FIG. 4) of the printing screen unit of FIG. 4.
Figure 6:
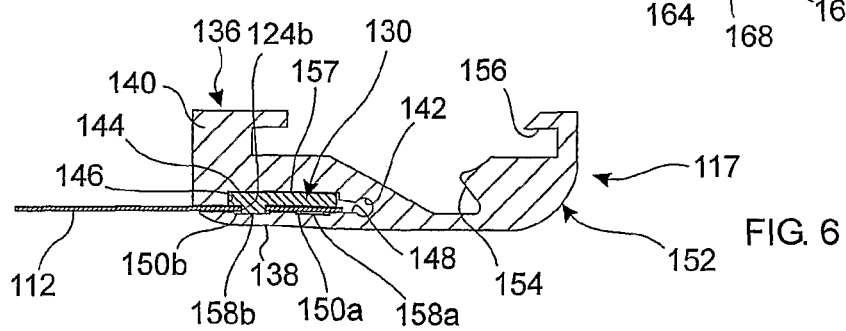
FIG. 6 illustrates a vertical sectional view (section II-II in FIG. 4) through an edge region of the printing screen unit of FIG. 4.

FIGS. 4 to 6 illustrate a printing screen unit 110 in accordance with a first embodiment of the present invention.

The printing screen unit 110 comprises a printing screen 112, in this embodiment of rectangular shape, and a supporting frame 114 for supporting the printing screen 112, which comprises first and second pairs of interface units 116, 116, 117, 117 which are attached to the respective pairs of opposite edges of the printing screen 112 and first to fourth corner pieces 118a-d which couple the respective ones of the interface units 116, 116, 117, 117.

The printing screen 112 includes a pattern of printing apertures 120 which define the pattern of deposits to be printed. The pattern of printing apertures 120 can be formed, for example, by laser cutting or etching, as is well known in the art. In preferred embodiments the printing screen 112 comprises a sheet of a metal, such as stainless steel, or a plastic.

The edges of the printing screen 112 to which tensioning mechanisms are attached each comprise a plurality of engagement apertures 124a and 124b (herein also collectively referenced as 124) along the length thereof which define an apertured engagement structure, which is engaged by at least one coupling element 130 of a respective one of the interface units 116, 116, 117, 117, such as to couple the respective edge of the printing screen 112 to the respective one of the interface units 116, 116, 117, 117, as will be described in more detail hereinbelow.

In this embodiment the engagement apertures 124 are circular in shape. The engagement apertures 124 could, however, have any shape, for, example, square, triangular, teardrop or elongate.

In this embodiment the edges of the printing screen 112 each include first and second rows of engagement apertures 124a, b, which are disposed one inwardly of the other and are located in offset relation along the length of the respective edge of the printing screen 112.

In this embodiment the engagement apertures 124 are formed by etching (chemical milling). In other embodiments the engagement apertures 124 could be formed using a press tool or laser. In further embodiments the engagement apertures 124 could be formed by electro-discharge machining (EDM) or water jet milling, which fabrication techniques would allow several printing screens 112 to be fabricated simultaneously. In still another embodiment the printing screen 112 could be formed by electroforming, and the engagement apertures 124 would be formed when forming the printing screen 112.

In one embodiment the engagement apertures 124 can be formed simultaneously with the pattern of printing apertures 120.

The interface units 116, 116, 117, 117 each comprise an interface member 126 which provides for engagement to a tensioning mechanism, in this embodiment an elongate member which extends along the length of the respective edge of the printing screen 112, and at least one coupling element 130 which couples the interface member 126 to the respective edge of the printing screen 112.

The interface member 126 includes a coupling section 136 which comprises a first, lower body part 138 and a second, upper body part 140, which together define a coupling slot 142 which extends along the length thereof and in which the at least one coupling element 130 and a respective one of the edges of the printing screen 112 are located, such that the respective edge of the printing screen 112 is held captive in the coupling section 136 by the at least one coupling element 130.

In this embodiment the coupling slot 142 comprises a first, support slot part 144, here including a flat supporting section, which supports the at least one coupling element 130 and includes an engagement surface 146 at an inner edge thereof, against which the at least one coupling element 130 is engaged when a tensioning force is applied to the interface member 126.

In this embodiment the coupling slot 142 further comprises a second slot part 148 which includes at least one recess, here as defined by first and second parallel slots 150a, b, which are in registration with the first and second rows of engagement apertures 124a, b in each of the edges of the printing screen 112.

The interface member 126 further includes an engagement section 152 which, relative to the printing screen 112, is disposed outwardly of the coupling section 136 and provides for engagement to a tensioning mechanism.

The engagement section 152 includes an inwardly-facing engagement surface 154, in this embodiment defined by a continuous surface, which extends along the length of the interface member 126. The engagement surface 154 is outwardly inclined from the free edge thereof relative to the printing screen 112, such as to define a hook arrangement which provides for captive engagement with a tensioning mechanism.

As will be appreciated, the engagement section 152, in being defined by a continuous surface, allows for fabrication by a wide variety of manufacturing techniques, such as machining, routing and extrusion.

The interface member 126 further includes recesses 156, in this embodiment of substantially rectangular section, at the distal ends thereof for receiving the tongue elements 166, 170 of respective corner pieces 118a-d, as will be described in more detail hereinbelow.

In this embodiment the coupling elements 130 each comprise an elongate body 157, here in the form of an elongate bar or strip of rectangular section, which is configured to fit in the support slot part 144 of the coupling slot 142 in a respective one of the interface members 126, and a plurality of engagement projections 158a and 158b (herein also collectively referenced as 158), here in the form of projecting studs, along the length thereof, which define a projecting engagement structure and are configured to engage the counterpart engagement apertures 124 in a respective one of the edges of the printing screen 112, as described hereinabove.

In this embodiment the engagement projections 158 are circular in shape, and have a shape and configuration such as to be a close fit in the counterpart engagement apertures 124 in the printing screen 112. The engagement projections 158 could, however, have any shape, for, example, square, triangular, teardrop or elongate, in the same manner as the engagement apertures 124 in the printing screen 112.

In this embodiment the length of at least ones of the engagement projections 158 is such that the distal ends of those engagement projections 158 extend into the at least one recess 150 in the second slot part 148 of the coupling slot 142 of the respective interface member 126 when the at least one coupling element 130 is fitted in the first slot part 144 of the coupling slot 142 of the respective interface member 126.

In this embodiment the coupling elements 130 each include first and second rows of engagement projections 158a, b, which are disposed one inwardly of the other and are located in offset relation along the length of the coupling element 130.

In this embodiment the interface units 116, 116, 117, 117 each include a single coupling element 130 which extends along the length of the respective interface member 126, or at least substantially the entire length thereof.

In an alternative embodiment the interface units 116, 116, 117, 117 could each include a plurality of coupling elements 130 which together extend along the length of the respective interface member 126, or at least substantially the entire length thereof. In one embodiment the ends of the adjacent coupling elements 130 could be disposed in juxtaposed, end-to-end relation. In another embodiment the ends of the adjacent coupling elements 130 could be spaced one from the other. With these configurations, coupling elements 130 of a stock set of lengths can be combined to accommodate interface members 126 of different length.

In this embodiment the corner pieces 118a-d each comprise first and second coupling members 159, 160, which lock together to define the respective corner pieces 118a-d.

In this embodiment the first coupling member 159 comprises a body element 162 which includes a slot 164, here of the same rectangular section as the recesses 156 in the distal ends of the interface members 126, which extends in a first direction therethrough, and a tongue element 166 for fitting in a respective one of the recesses 156 in the distal ends of the interface members 126 which extends from the body element 162 in a second direction orthogonal to the first direction of the slot 164 therein.

In this embodiment the second coupling member 160 comprises a body element 168, and a tongue element 170 for fitting in an adjacent one of the recesses 156 in the distal ends of the interface members 126 which extends from the body element 168. The body element 168 of the second coupling member 160 is configured to be a tight, snap-fit in the slot 164 in the body element 162 of the first coupling member 159 such that, when inserted therein, the tongue elements 166, 170 of the coupling members 159, 160 are locked in a coupling configuration. In one embodiment the coupling members 159, 160 could be bonded together.

With this configuration, the coupling members 159, 160 allow for the in situ assembly of the last of the corner pieces 118a-d to be fitted, in enabling the tongue elements 166, 170 of the respective pair of the coupling members 159, 160 to be inserted into respective recesses 156 in the distal ends of the interface members 126 in assembling the last corner piece 118a-d. It will be appreciated that three of the corner pieces 118a-d can be pre-assembled and need not be assembled in situ. Indeed, in one embodiment three of the corner pieces 118a-d can be fabricated as an integral unit, typically as a moulding or casting.

In this embodiment the tongue elements 166, 170 of the coupling members 159, 160 are configured such as to be a tight fit in the recesses 156 in the distal ends of the interface members 126, but such as to allow for movement of the tongue elements 166, 170 in the respective recesses 156 in the direction of a tension as applied to the printing screen 112. With this configuration, the interface members 126 present a substantially rigid frame when handled, but allow for relative movement of respective opposite pairs of the interface members 126 on being tensioned by tensioning mechanisms. In allowing for relative movement of the interface members 126, design tolerances can be accommodated in order to provide for uniform tensioning of the printing screen 112.

In fitting the supporting frame 114 to the printing screen 112, the interface units 116, 116, 117, 117 are fitted to the respective edges of the printing screen 112, and the ends of the interface units 116, 116, 117, 117 are coupled by the corner pieces 118a-d. In fitting an interface unit 116, 116, 117, 117 to the printing screen 112, the at least one coupling element 130 of the interface unit 116, 116, 117, 117 is fitted to one edge of the printing screen 112 by inserting the engagement projections 157 of the at least one coupling element 130 into the counterpart engagement apertures 124 in the respective edge of the printing screen 112, and then sliding the at least one coupling element 130 and the edge of the printing screen 112 into the coupling slot 142 of the respective interface member 126. With the at least one coupling element 130 and the edge of the printing screen 112 so inserted into the interface member 126, the edge of the printing screen 112 is then held captive to the interface member 126. This procedure is then repeated in fitting the other interface units 116, 116, 117, 117 to the other edges of the printing screen 112. With the interface units 116, 116, 117, 117 so fitted, the corner pieces 118a-d are fitted such as to couple the respective ends of the interface members 126 and thereby form the supporting frame 114.

Figure 7:
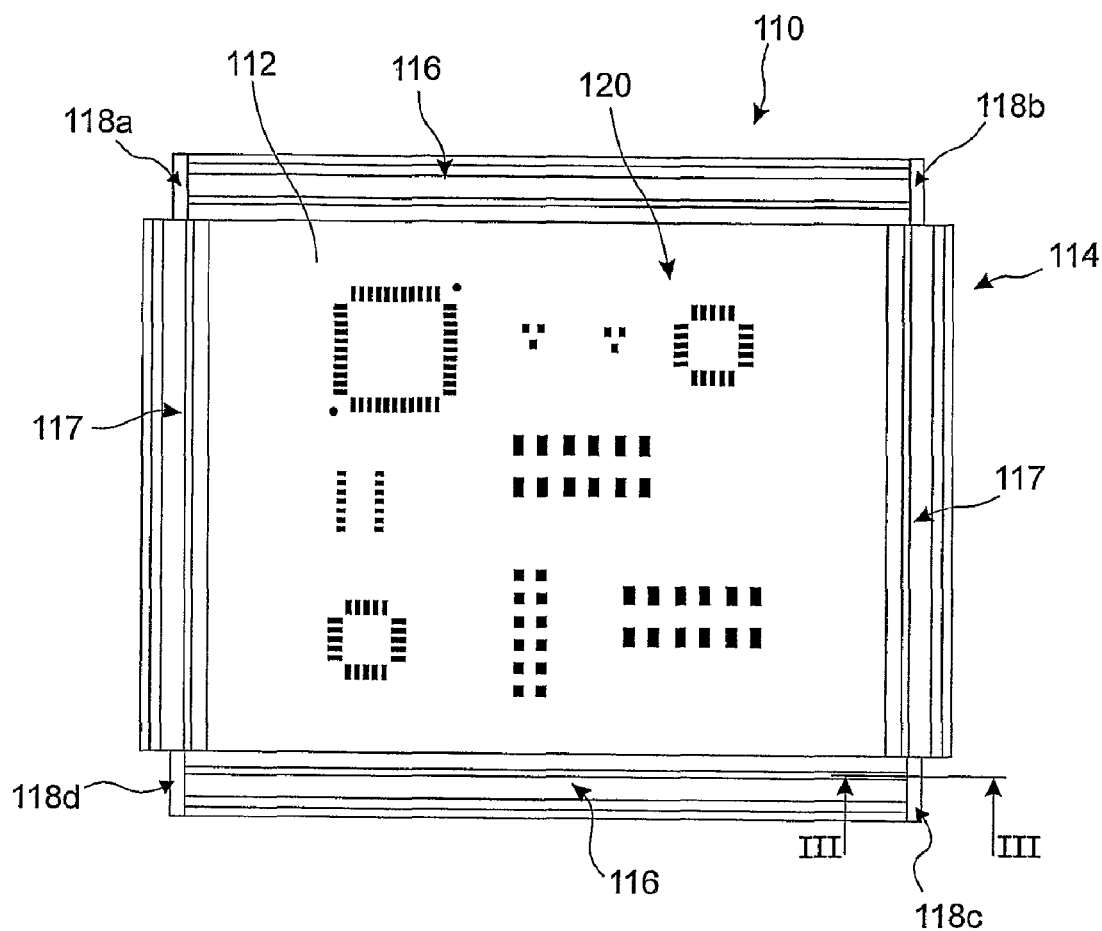
FIG. 7 illustrates a plan view of a printing screen unit in accordance with a second embodiment of the present invention.
Figure 8:
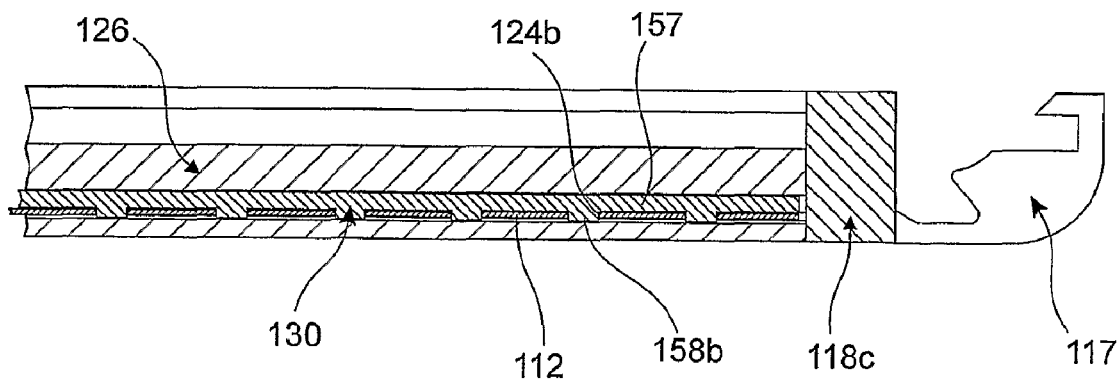
FIG. 8 illustrates a vertical sectional view (along section III-III in FIG. 7) of the printing screen unit of FIG. 7.

FIGS. 7 and 8 illustrate a printing screen unit in accordance with a second embodiment of the present invention.

The printing screen unit 110 of this embodiment is quite similar to the printing screen unit 110 of the above-described first embodiment, and thus, in order to avoid unnecessary duplication of description, only the differences will be described in detail, with like parts being designated by like reference signs.

The printing screen unit 110 of this embodiment differs from the printing screen unit 110 of the above-described first embodiment in the configuration of the interface units 116, 116, 117, 117 and the corner pieces 118a-d.

In this embodiment one of the opposite pairs of the interface units 116, 116 are longer than the other of the opposite pairs of interface units 117, 117, such as at least partially to overlap the adjacent ends of the opposite pair of interface units 117, 117, and the corner pieces 118a-d are defined by stop elements which are disposed at the ends of the one pair of interface units 116, 116. In this embodiment the one pair of interface units 116, 116 have a length which is substantially the same as the respective edges of the printing screen 112, but, as illustrated in FIG. 8, the interface members 126 of the one pair of interface units 116, 116 are marginally longer than the at least one coupling elements 130 thereof and the respective edges of the printing screen 112, in order to accommodate stretching of the printing screen 112 when tensioned.

With this configuration, the one pair of interface units 116, 116 act to trap the other pair of interface units 117, 117, and prevent the same from sliding from the respective edges of the printing screen 112, and the one pair of interface units 116, 116 are prevented from sliding from the printing screen 112 by the corner pieces 118a-d.

In this embodiment the corner pieces 118a-d comprise end caps which are attached to the respective ends of the one pair of interface units 116, 116. In preferred embodiments the corner pieces 118a-d can be formed of a metal or a synthetic material.

In this embodiment the corner pieces 118a-d are fixedly coupled to the ends of the interface units 116, 116, here by bonding. In alternative embodiments the corner pieces 118a-d could be fixed by pins or threaded screws.

In an alternative embodiment the corner pieces 118a-d could comprise end caps which are attached to the respective ends of the other pair of interface units 117, 117.

Figure 9:
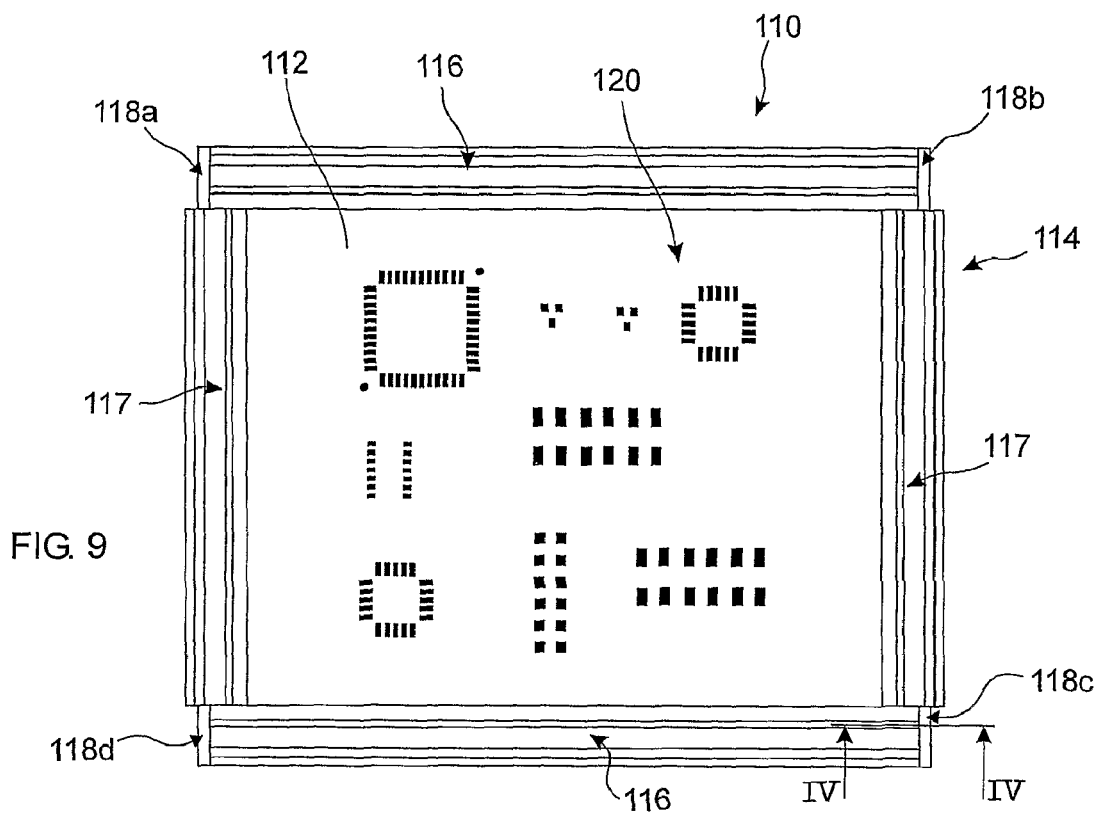
FIG. 9 illustrates a plan view of a printing screen unit in accordance with a third embodiment of the present invention.
Figure 10:
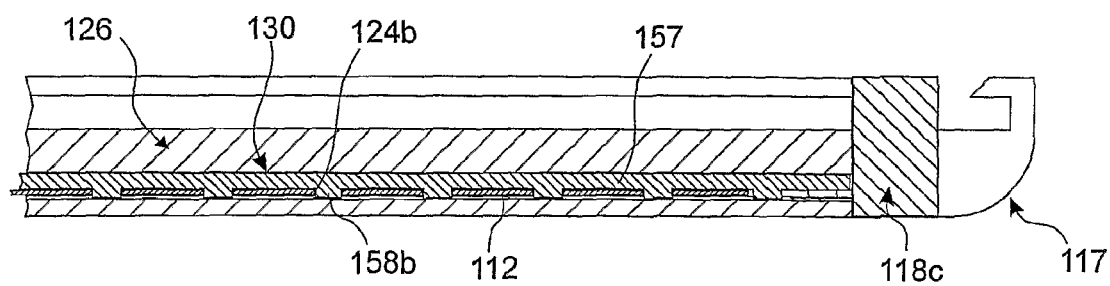
FIG. 10 illustrates a vertical sectional view (along section IV-IV in FIG. 9) of the printing screen unit of FIG. 9.

FIGS. 9 and 10 illustrate a printing screen unit in accordance with a third embodiment of the present invention.

The printing screen unit 110 of this embodiment is quite similar to the printing screen unit 110 of the above-described first embodiment, and thus, in order to avoid unnecessary duplication of description, only the differences will be described in detail, with like parts being designated by like reference signs.

The printing screen unit 110 of this embodiment differs from the printing screen unit 110 of the above-described first embodiment in the configuration of the interface units 116, 116, 117, 117 and the corner pieces 118a-d.

In this embodiment one of the opposite pairs of the interface units 116, 116 are longer than the other of the opposite pairs of interface units 117, 117, such as at least partially to overlap the adjacent ends of the opposite pair of interface units 117, 117, and the corner pieces 118a-d are defined by stop elements which are disposed at the ends of the one pair of interface units 116, 116. In this embodiment the one pair of interface units 116, 116, that is, the interface member 126 and the at least one coupling element 130 thereof, have a length which is longer than the respective edges of the printing screen 112. As illustrated in FIG. 10, the at least one coupling elements 130 are marginally shorter than the interface members 126 of the one pair of interface units 116, 116, in order to accommodate stretching of the printing screen 112 when tensioned.

With this configuration, the one pair of interface units 116, 116 act to trap the other pair of interface units 117, 117, and prevent the same from sliding from the respective edges of the printing screen 112, and the one pair of interface units 116, 116 are prevented from sliding from the printing screen 112 by the corner pieces 118a-d.

In this embodiment the corner pieces 118a-d comprise end caps which are attached to the respective ends of the one pair of interface units 116, 116. In preferred embodiments the corner pieces 118a-d can be formed of a metal or a synthetic material.

In this embodiment the corner pieces 118a-d are fixedly coupled to the ends of the interface units 116, 116, here by bonding. In alternative embodiments the corner pieces 118a-d could be fixed by pins or threaded screws.

In an alternative embodiment the corner pieces 118a-d could comprise end caps which are attached to the respective ends of the other pair of interface units 117, 117.

Figure 11:
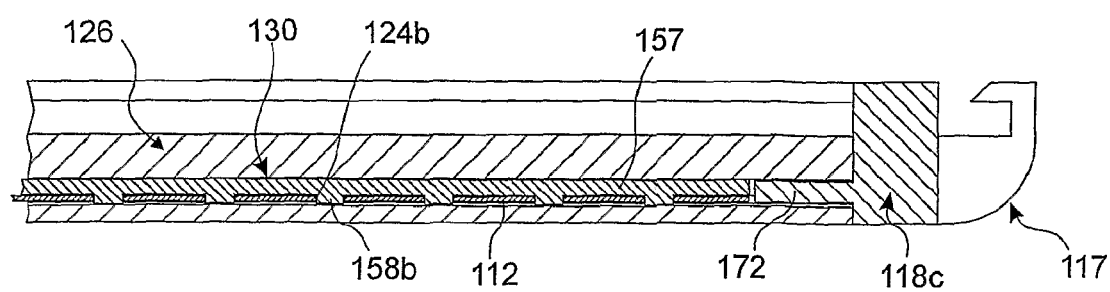
FIG. 11 illustrates a vertical sectional view (along section IV-IV in FIG. 9) of one modification of the printing screen unit of FIG. 9.

In one modification, as illustrated in FIG. 11, the at least one coupling elements 130 of the one pair of interface units 116, 116 are formed so as to be shorter than the interface members 126 thereof, in this embodiment having substantially the same length as the respective edges of the printing screen 112, and the corner pieces 118a-d each include a tongue element 172 which is a push fit in the ends of the coupling slots 142 in the interface members 126 of the one pair of interface units 116, 116, such as to provide for frictional retention of the corner pieces 118a-d. In this embodiment the tongue element 172 of each of the corner pieces 118a-d has substantially the same length as the extended length at each of the ends of the interface members 126 of the one pair of interface units 116, 116, but are marginally shorter, in order to accommodate stretching of the printing screen 112 when tensioned.

Figure 12:
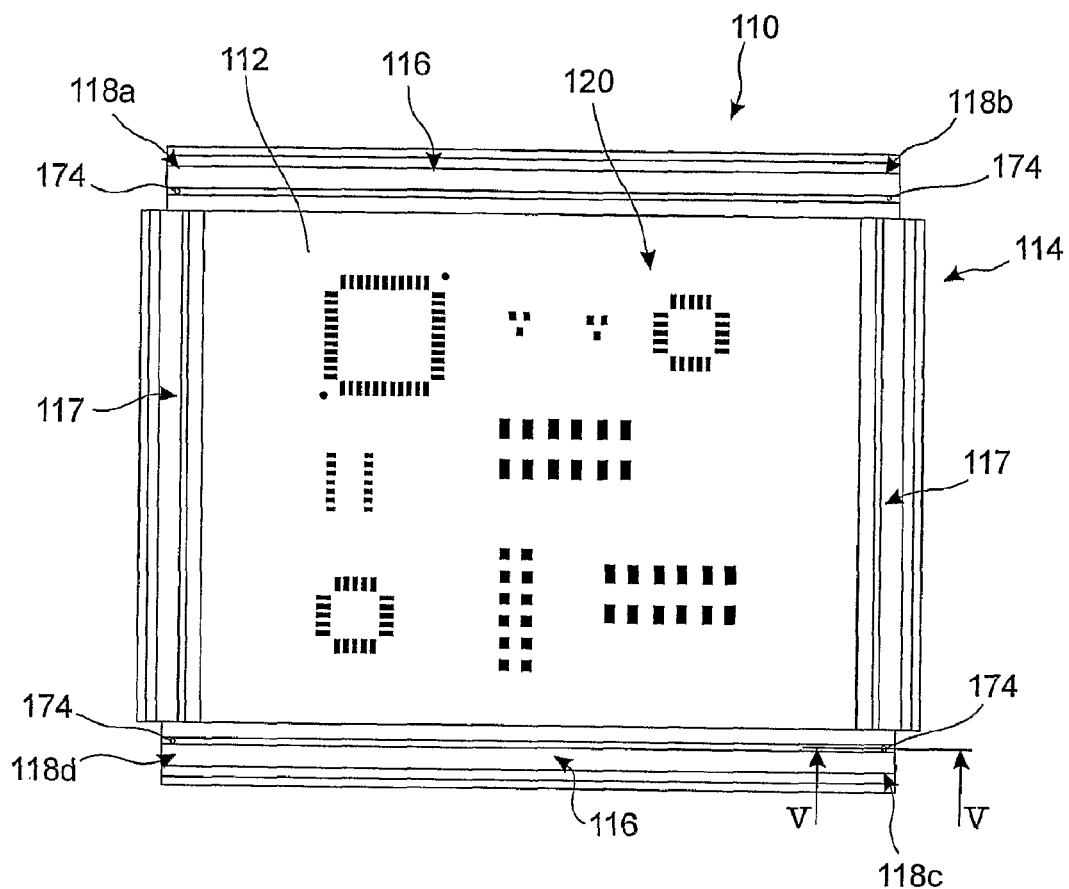
FIG. 12 illustrates a plan view of a printing screen unit in accordance with a fourth embodiment of the present invention.
Figure 13:
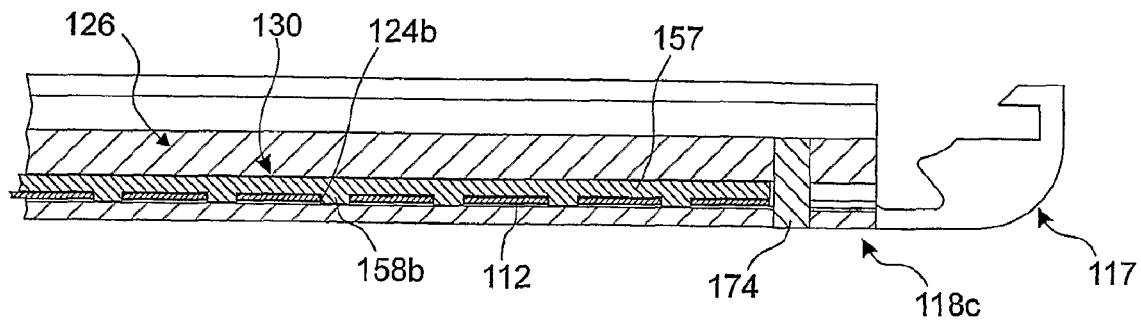
FIG. 13 illustrates a vertical sectional view (along section V-V in FIG. 12) of the printing screen unit of FIG. 12.

FIGS. 12 and 13 illustrate a printing screen unit in accordance with a fourth embodiment of the present invention.

The printing screen unit 110 of this embodiment is quite similar to the printing screen unit 110 of the above-described first embodiment, and thus, in order to avoid unnecessary duplication of description, only the differences will be described in detail, with like parts being designated by like reference signs.

The printing screen unit 110 of this embodiment differs from the printing screen unit 110 of the above-described first embodiment in the configuration of the interface units 116, 116, 117, 117 and the corner pieces 118a-d.

In this embodiment one of the opposite pairs of the interface units 116, 116 are longer than the other of the opposite pairs of interface units 117, 117, such as at least partially to overlap the adjacent ends of the opposite pair of interface units 117, 117, and the corner pieces 118a-d are defined by the respective ends of the one pair of interface units 116, 116.

In this embodiment the interface members 126 of the one pair of interface units 116, 116 have a length which is longer than the respective edges of the printing screen 112 and the at least one coupling elements 130 of the one pair of interface units 116, 116 are formed so as to be shorter than the interface members 126 thereof, in this embodiment having substantially the same length as the respective edges of the printing screen 112, and the extended length at each of the ends of the interface members 126 of the one pair of interface units 116, 116 defines the corner pieces 118a-d.

In this embodiment the one pair of interface units 116, 116 each include retaining elements 174 which are disposed to the respective ends of the interface members 126 thereof and act to retain the interface members 126 to the respective edges of the printing screen 112. In this embodiment the retaining elements 174 are located at positions marginally beyond the ends of the printing screen 112, such as to accommodate stretching of the printing screen 112 when tensioned. In this embodiment the retaining elements 174 comprise pins, but in other embodiments could comprise screws.

With this configuration, the one pair of interface units 116, 116 act to trap the other pair of interface units 117, 117, and prevent the same from sliding from the respective edges of the printing screen 112, and the one pair of interface units 116, 116 are prevented from sliding from the printing screen 112 by the retaining elements 174 thereof.

Finally, it will be understood that the present invention has been described in its preferred embodiments and can be modified in many different ways without departing from the scope of the invention as defined by the appended claims.

For example, in one modification, the printing screen 112 could include any arrangement of engagement apertures 124 along each of the edges thereof and the coupling elements 130 could each include any counterpart arrangement of engagement projections 158, with the interface member 126 including one or more counterpart recesses 150. In such alternative embodiments the printing screen 112 could include any number of rows of engagement apertures 124 along each of the edges thereof, for example, a single row or three or more rows, and the coupling elements 130 could each include any counterpart number of rows of engagement projections 158, with the interface member 126 including one or more counterpart recesses 150. In other embodiments the engagement apertures 124 in the printing screen 112 and the engagement projections 158 of the coupling elements 130 can be arranged in other than rows.

Figure 14:
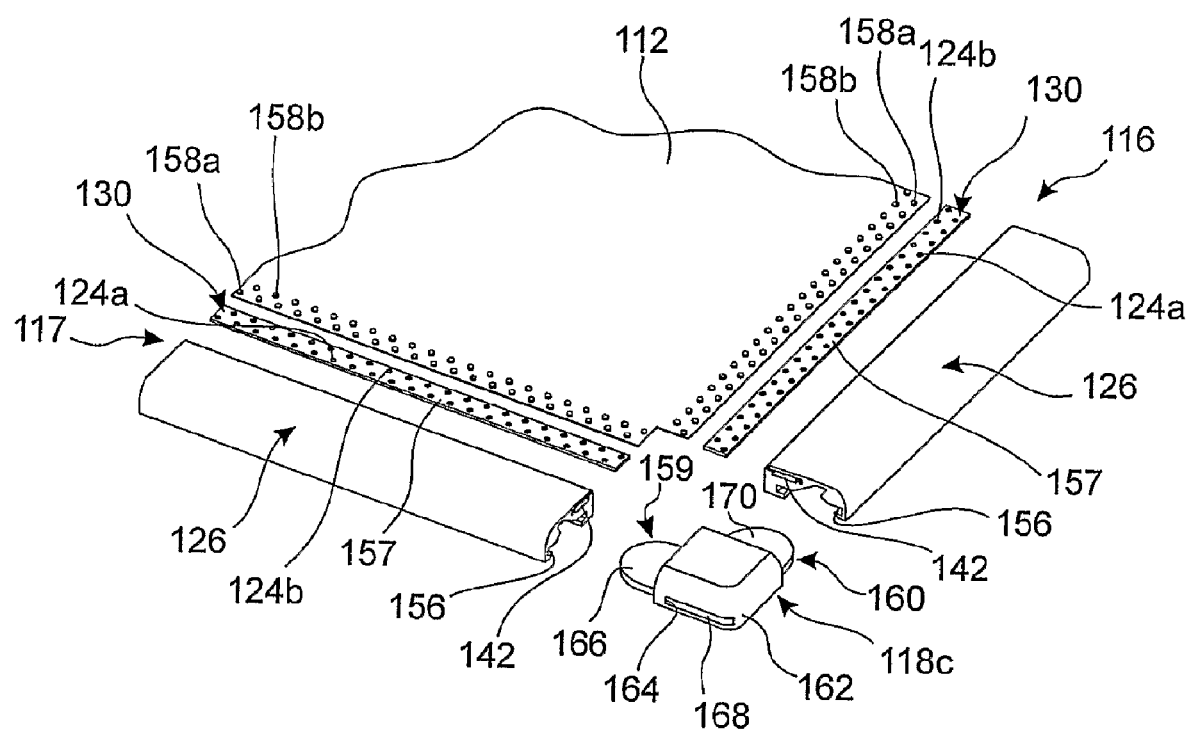
FIG. 14 illustrates an exploded perspective view from above of one corner region (region A in FIG. 1) of one modification of the printing screen unit of FIG. 1.

In another modification, as illustrated in FIG. 14, the printing screen 112 could include the engagement projections 158 instead of the embodied engagement apertures 124 and the coupling elements 130 of the interface units 116, 116, 117, 117 could include the engagement apertures 124 instead of the embodied engagement projections 158. In another embodiment the printing screen 112 could include a combination of the engagement apertures 124 and the engagement projections 158 and the coupling elements 130 of the interface units 116, 116, 117, 117 could include the counterpart combination of the engagement apertures 124 and the engagement projections 158.

The invention claimed is:

1. A printing screen unit, comprising:
a printing screen, comprising a sheet, at least sections of at least one pair of opposite edges of which include one of engagement apertures or engagement projections; and
a supporting frame including at least one pair of interface units which are attached to the at least one pair of opposite edges of the printing screen, wherein the interface units each comprise at least one coupling element which includes the other of engagement apertures or engagement projections for inter-engaging with the one of engagement apertures or engagement projections at a respective one of the opposite edges of the printing screen, and an interface member for engagement to a tensioning mechanism which includes a coupling section which comprises first and second body parts which together define a coupling slot therebetween which receives the at least one coupling element and the respective edge of the printing screen and captively holds the at least one coupling element therein, wherein the coupling slot and the at least one coupling element are configured such that, when fitting the printing screen to the interface unit, the at least one coupling element and the respective edge of the printing screen are slideably fitted into the coupling slot.

2. The printing screen unit of claim 1, wherein at least ones of the engagement apertures and engagement projections are circular in shape.

3. The printing screen unit of claim 1, wherein the at least one pair of opposite edges of the printing screen include engagement apertures and the at least one coupling element of each interface unit includes engagement projections for engagement with the engagement apertures in the respective edges of the printing screen.

4. The printing screen unit of claim 1, wherein at least sections of the at least one pair of opposite edges of the printing screen include a plurality of rows of one of engagement apertures or engagement projections which are disposed one inwardly of the other relative to the respective edge of the printing screen and the coupling elements of the interface units include a plurality of rows of the other of engagement apertures or engagement projections which correspond to the rows of the one of engagement apertures or engagement projections in the respective edges of the printing screen.

5. The printing screen unit of claim 4, wherein the rows of the one of engagement apertures or engagement projections in each edge of the printing screen are located in offset relation along a length of the respective edge of the printing screen and the rows of the other of engagement apertures or engagement projections on each coupling element are located in a counterpart offset relation.

6. The printing screen unit of any of claim 1, wherein the at least one coupling element is an element separate to the printing screen.

7. The printing screen unit of any of claim 1, wherein the coupling slot comprises a support slot part which supports the at least one coupling element and includes an engagement surface at an inner edge thereof, against which the at least one coupling element is engaged when a tensioning force is applied to the interface member.

8. The printing screen unit of claim 7, wherein the coupling slot comprises a recessed slot part which includes at least one recess into which extend the distal ends of the engagement projections, such as to retain the printing screen captively thereon.

9. The printing screen unit of claim 7, wherein the supporting slot part and the recessed slot part are disposed in opposed relation.

10. The printing screen unit of claim 1, wherein the interface member includes an engagement section which, relative to the printing screen, is disposed outwardly of the coupling slot and provides for engagement to a tensioning mechanism.

11. The printing screen unit of claim 1, wherein the supporting frame includes one pair of interface units which are attached to one pair of opposite edges of the printing screen.

12. The printing screen unit of claim 1, wherein the printing screen has two pairs of opposite edges, at least sections of which include the one of engagement apertures or engagement projections, and the supporting frame comprises first and second pairs of interface units which are attached to the respective pairs of opposite edges of the printing screen.

13. The printing screen unit of claim 12, wherein the supporting frame further comprises corner pieces which are disposed adjacent ends of the interface units.

14. The printing screen unit of claim 13, wherein the corner pieces couple adjacent ends of the interface units.

15. The printing screen unit of claim 13, wherein the corner pieces are parts separate to the interface units or integral parts of at least ones of the interface units.

16. The printing screen unit of claim 13, wherein the interface members of one of the pairs of interface units are longer than the interface members of the other of the pairs of interface units, such that the ends of the interface members of the one of the pairs of interface units overlap the adjacent ends of the interface members of the other of the pairs of interface units.

17. The printing screen unit of claim 16, wherein the corner pieces are parts separate to the interface units and are attached to the ends of the interface members of the one of the pairs of interface units or defined by the ends of the interface members of the one of the pairs of interface units.

18. The printing screen unit of claim 1, wherein each coupling element comprises an elongate strip which includes the other of engagement apertures or engagement projections thereon.

19. The printing screen unit of claim 1, wherein at least ones of the interface units comprise a plurality of coupling elements.

20. The printing screen unit of claim 19, wherein the coupling elements are disposed in one of end-to-end relation along a length of the interface member or spaced relation along a length of the interface member.

21. The printing screen unit of claim 1, wherein the supporting frame provides for relative movement of the interface members on being tensioned by a tensioning mechanism.

22. The printing screen unit of claim 1, wherein the printing screen includes a pattern of printing apertures which define a pattern of deposits to be printed thereby or is a blank and includes no printing apertures therein.

23. The printing screen unit of claim 1, wherein the printing screen comprises one of a metal sheet or a plastics sheet.

24. A supporting frame for supporting a printing screen, comprising a sheet, at least sections of at least one pair of opposite edges of which include one of engagement apertures or engagement projections, the supporting frame comprising: at least one pair of interface units which are attachable to the at least one pair of opposite edges of the printing screen, wherein the interface units each comprise at least one coupling element which includes the other of engagement apertures or engagement projections for inter-engaging with the one of engagement apertures or engagement projections at a respective one of the opposite edges of the printing screen, and an interface member for engagement to a tensioning mechanism which includes a coupling section which comprises first and second body parts which together define a coupling slot therebetween which receives the at least one coupling element and the respective edge of the printing screen and captively holds the at least one coupling element therein, wherein the coupling slot and the at least one coupling element are configured such that, when fitting the printing screen to the interface unit, the at least one coupling element and the respective edge of the printing screen are slideably fitted into the coupling slot.

25. The supporting frame of claim 24, wherein at least ones of the engagement apertures and engagement projections are circular in shape.

26. The supporting frame of claim 24, wherein the at least one pair of opposite edges of the printing screen include engagement apertures and the at least one coupling element of each interface unit includes engagement projections for engaging the engagement apertures in the edges of the printing screen.

27. The supporting frame of claim 24, wherein at least sections of the at least one pair of opposite edges of the printing screen include a plurality of rows of one of engagement apertures or engagement projections which are disposed one inwardly of the other relative to the respective edge of the printing screen and the coupling elements of the interface units include a plurality of rows of the other of engagement apertures or engagement projections which correspond to the rows of the one of engagement apertures or engagement projections in the respective edges of the printing screen.

28. The supporting frame of claim 27, wherein the rows of the one of engagement apertures or engagement projections in each edge of the printing screen are located in offset relation along a length of the respective edge of the printing screen and the rows of the other of engagement apertures or engagement projections on each coupling element are located in a counterpart offset relation.

29. The supporting frame of claim 24, wherein the at least one coupling element is an element separate to the printing screen.

30. The supporting frame of claim 24, wherein the coupling slot comprises a support slot part which supports the at least one coupling element and includes an engagement surface at an inner edge thereof, against which the at least one coupling element is engaged when a tensioning force is applied to the interface member.

31. The supporting frame of claim 30, wherein the coupling slot comprises a recessed slot part which includes at least one recess into which extend the distal ends of the engagement projections, such as to retain the printing screen captively thereon.

32. The supporting frame of claim 30, wherein the supporting slot part and the recessed slot part are disposed in opposed relation.

33. The supporting frame of claim 24, wherein the interface member includes an engagement section which is disposed outwardly of the coupling slot and provides for engagement to a tensioning mechanism.

34. The supporting frame of claim 24, including:
one pair of interface units which are in use attached to one pair of opposite edges of the printing screen.

35. The supporting frame of claim 24, wherein the printing screen has two pairs of opposite edges, at least sections of which include the one of engagement apertures or engagement projections, and comprising: first and second pairs of interface units which are in use attached to the respective pairs of opposite edges of the printing screen.

36. The supporting frame of claim 35, further comprising: corner pieces which are disposed adjacent ends of the interface units.

37. The supporting frame of claim 36, wherein the corner pieces couple adjacent ends of the interface units.

38. The supporting frame of claim 36, wherein the corner pieces are parts separate to the interface units or integral parts of at least ones of the interface units.

39. The supporting frame of claim 36, wherein the interface members of one of the pairs of interface units are longer than the interface members of the other of the pairs of interface units, such that the ends of the interface members of the one of the pairs of interface units overlap the adjacent ends of the interface members of the other of the pairs of interface units.

40. The supporting frame of claim 39, wherein the corner pieces are parts separate to the interface units and are attached to the ends of the interface members of the one of the pairs of interface units or defined by the ends of the interface members of the one of the pairs of interface units.

41. The supporting frame of claim 24, wherein each coupling element comprises an elongate strip which includes the other of the engagement apertures or engagement projections thereon.

42. The supporting frame of claim 24, wherein at least ones of the interface units comprise a plurality of coupling elements.

43. The supporting frame of claim 42, wherein the coupling elements are disposed in one of end-to-end relation along a length of the interface member or spaced relation along a length of the interface member.

44. The supporting frame of claim 24, where configured to provide for relative movement of the interface members on being tensioned by a tensioning mechanism.

* * * * *